US009632336B2

(12) United States Patent
Tannas, Jr.

(10) Patent No.: US 9,632,336 B2
(45) Date of Patent: Apr. 25, 2017

(54) METHODS OF MAKING AND REPAIRING RESIZED FLAT PANEL DISPLAYS

(71) Applicant: Lawrence E. Tannas, Jr., Orange, CA (US)

(72) Inventor: Lawrence E. Tannas, Jr., Orange, CA (US)

(*) Notice: Subject to any disclaimer, the term of this patent is extended or adjusted under 35 U.S.C. 154(b) by 211 days.

(21) Appl. No.: 13/679,979

(22) Filed: Nov. 16, 2012

(65) Prior Publication Data

US 2013/0075357 A1  Mar. 28, 2013

Related U.S. Application Data

(63) Continuation of application No. PCT/US2011/031989, filed on Apr. 11, 2011, which is a continuation-in-part of application No. 12/781,624, filed on May 17, 2010, now Pat. No. 8,259,282.

(51) Int. Cl.
*G02F 1/13* (2006.01)
*G02F 1/1333* (2006.01)
*G02F 1/1339* (2006.01)

(52) U.S. Cl.
CPC ...... *G02F 1/1303* (2013.01); *G02F 1/133351* (2013.01); *G02F 1/1309* (2013.01); *G02F 1/1339* (2013.01); *H01L 2251/566* (2013.01); *H01L 2251/568* (2013.01); *Y10T 156/1062* (2015.01)

(58) Field of Classification Search
USPC .................................. 216/13; 349/1; 445/2
See application file for complete search history.

(56) References Cited

U.S. PATENT DOCUMENTS

| 6,204,906 | B1 | 3/2001 | Tannas |
| 8,259,282 | B2 | 9/2012 | Tannas |
| 2009/0004944 | A1* | 1/2009 | Tannas, Jr. .................. 445/2 |

FOREIGN PATENT DOCUMENTS

JP       2007322610   * 12/2002  ........... G02F 1/1343

OTHER PUBLICATIONS

International Preliminary Report on Patentability for corresponding International Application No. PCT/US2011/031989, Applicant: Lawrence E. Tannas, Jr., Nov. 28, 2011, 6 pages.
English translation of Japanese Publication JP 2007/322,610, Japanese Patent Office, 12 pages.

* cited by examiner

*Primary Examiner* — Nadine Norton
*Assistant Examiner* — Mahmoud Dahimene
(74) *Attorney, Agent, or Firm* — William A. English; Vista IP Law Group LLP

(57) ABSTRACT

Electronic flat panel displays (FPDs) including liquid crystal displays (LCDs) may be resized to meet custom size requirements for applications in aerospace and elsewhere. During the resizing process, pixel line defects may occur in the image due to electrical short circuits at the resized cut edge. Methods for repairing such short circuits are described, including use of mechanical, electrical, chemical, thermal, and/or other methods, and any combination thereof, to open the short circuits. The methods may be applied to the sealed cut edge to ruggedize the seal, even if image defects are not exhibited initially. The repaired short circuits may be stress tested to ensure the defects will not recur during the life of the display, and the repaired areas may be resealed.

22 Claims, 4 Drawing Sheets

METHODS OF MAKING AND REPAIRING RESIZED FLAT PANEL DISPLAYS

RELATED APPLICATION DATA

This application is a continuation of co-pending International Application No. PCT/US2011/031989, filed Apr. 11, 2011, which is a continuation-in-part of U.S. application Ser. No. 12/781,624, filed May 17, 2010, now U.S. Pat. No. 8,259,282, the entire disclosures of which are expressly incorporated by reference herein.

FIELD OF THE INVENTION

The present invention relates to the field of resizing Liquid Crystal Displays ("LCDs") and similar electronic Flat Panel Displays ("FPDs"). Additionally, the present invention relates to the repair and/or prevention of electrical shorts that may occur because of the resizing process. In addition, the present invention relates to methods for making resized displays within minimal mullions, e.g., to facilitate tiling of multiple displays and/or minimizing the inactive border of resized displays.

BACKGROUND

Electronic displays are commonly used to portray data in the form of visual information to be acted upon by the user. The information is typically derived from a computer and used interactively to conduct data and word processing, advertising signage, as aerospace instruments, to fly airplanes, to control machines, and the like. Today, LCDs are the leading technology for such displays. LCDs are electronic FPDs that have great industrial utility.

To more easily understand the nature of the problem addressed by the methods described herein, a brief description of the structure and operation of an LCD as an example of an FPD and of resizing an LCD follows. Additional information may be found in U.S. Pat. Nos. 7,535,547 and 7,780,492, the entire disclosures of which are expressly incorporated by reference herein.

With reference generally to FIG. 1, an LCD is made from two substrates 20 of transparent material, typically glass among other things, with a thin film of liquid crystal material sealed between the two substrates 20, thereby providing a "cell" to which external electronics (not shown) may be coupled. Spacers (not shown) may be placed in between the substrates 20 in a precise manner along with the liquid crystal material, thus forming a uniformly spaced cell, which is sealed by a perimeter seal 25. The display's active area is defined by electrodes (not shown) on the inside of the substrate in the cell area organized to address picture elements (pixels). There are many pixels electrically stimulated (controlled) to create images. Each pixel is controlled by electrodes 30 that continue outside of the seal area to the edge of the substrate(s) 20. The electrodes 30 are connected to external electronics (not shown) that, in turn, are connected to a computer or similar electrical stimulus. A pixel is formed at each intersection of a row and column line and there may be other electrical components at the intersection such as thin film transistors (TFTs), capacitors, and/or other conducting lines such as ground potential lines (also not shown). Typically, the electrodes 30 are thin film metal conductors organized in lines of rows and columns with hundreds of row and column electrodes running the full length and width of the substrate(s) 20, wherein one row electrode line and one column electrode line are associated with each pixel in a matrix-like organization. Typically, in an active matrix type LCD, all of the row and column electrodes 30 are on the inside surface of one of the substrates 20, and a common ground plane 35 is on the inside surface of the opposing substrate. The liquid crystal material and spacers are between the electrodes 30 and the ground plane 35. All of the row, column and ground plane electrodes are insulated from one another except at unique points to facilitate the operation of the display. The liquid crystal film, spacers, substrates, and the sealant enclosing the cell, are generally all dielectrics.

When a display is resized, the cell is cut, e.g., by scribing and breaking, sawing, or otherwise cutting through the substrates 20, to separate the display into a target portion 5 having a cut, exposed edge 55 and a waste portion (not shown). When this occurs, all of the thin film electrodes 30 may not separate exactly along the cut edge 55. In other words, the conductor lines 30 and the ground plane 35 may be disturbed by the resizing process, thus possibly causing undesired electrical contact in some manner.

In the simplest example, some electrodes 30 may tear loose from the substrate 20 at the cut edge 55 and make physical contact with each other or with the ground plane 35, thus causing an undesirable electrical short circuit. Examples of conductor lines 30 shorting to the ground plane 35 are shown in FIG. 1, labeled specifically as 30-s1 (representing a line that became dislodged from the substrate) and 30-s2 (representing a line that became bent). As shown in FIG. 2, sealant 45 may be applied along the cut edge 55, e.g., between the substrates 20, and this application of sealant 45 and the inevitable fluid motion may cause additional shorts. The exact detail of how the short circuits occur is not significant, as any short at the cut line will adversely affect the active image area 40 of the display. In addition, the electrodes in question may be very close such that they may short at a later time due to contamination or motion at the location in question.

Such electrical shorts may undesirably be cemented and bound together when the target portion of the display is resealed. In that case, when the display is tested and/or otherwise used to display an image, the pixels connected to the shorted row or column line(s) 30 will not respond properly to the image signal and will act as if the pixels associated with the shorted electrode have failed. Typically, this means the image would appear to have a line of failed pixels as a result of a shorted conductor line extending from the point of the short circuit along the shorted line into the image area 40. In FIG. 2, the location of an image failure resulting from a shorted conductor line 30-s1 is represented symbolically as a row of x's 50. When a short occurs, the impacted pixels and electrodes are generally in a straight line, although that may not always be the case.

Multiple shorted lines may exist simultaneously. The failed pixels may only extend a short distance from the cut edge in the case of very weak shorts, or not at all if the short is so weak or not quite complete such that its effect or potential effect is not ramified in the image. Many types of shorts can occur in many ways or at different times. In such cases, the resized target display would be deemed defective unless the resized image area was restored to eliminate the resulting failed pixels caused by any shorts or belated shorts at the cut and resealed edge 55.

There is thus a desire for a method to remove any shorts caused by the process of resizing a display and/or to restore the failed pixels in the image of a resized display caused by any shorted electrical lines at the cut edge. Further, it is recommended to perform steps to ensure any shorts or belated shorts are permanently removed and do not reoccur during the operational life of the resized display.

SUMMARY OF THE INVENTION

The present invention is directed to methods for resizing electronic displays, particularly Liquid Crystal Displays ("LCDs") and/or other electronic Flat Panel Displays ("FPDs"), such as Organic Light Emitting Diode displays, electrophoretic displays, electroluminescent displays, and the like. More particularly, the present invention relates to methods for repairing and/or preventing electrical shorts that may occur due to resizing such displays and/or to methods for making resized displays within minimal mullions, e.g., to facilitate tiling of multiple displays and/or minimizing the inactive border of the resized displays.

With reference to FIGS. 1 and 2, when the target portion 5 of an FPD (such as an LCD) is cut or otherwise separated from the waste portion during a resizing process, the cutting, breaking, and/or other separation of the substrate 20 may have a physical effect along the cut edge 55 that could lead to short circuits along the cut edge 55. For example, the conductor lines 30 may separate from the substrate(s) 20. Further, the conductor lines 30 may contact the ground plane 35 (as represented by 30-s1 and 30-s2) or each other and cause undesirable short circuits. In these cases, the electrical signal for the display image is short circuited, thus inhibiting a proper signal to the pixels.

The methods herein may facilitate repair of such electrical shorts that may occur during the process of resizing an LCD or similar FPD and/or may remove potential future shorts, which may result from the proximity of the cut electrodes. In an exemplary embodiment, such repair may involve the act of physically reducing the electrode ends to the extent necessary to stop and prevent shorts which cause pixel failures in the image. In addition, the methods herein may enhance the removal of shorts or near shorts so that they do not reoccur during the operating life of the resized display.

This may be accomplished by using any one or more of mechanical, electrical, chemical, and/or thermal means, used alone, sequentially and/or substantially simultaneously. As part of the repair process, the repaired area(s) may be stress tested to ensure that the shorts are sufficiently opened and the conductors are sufficiently separated that they do not occur or recur during the life of the resized display. Further, the cut line area of the resized display may be stress tested to ensure any marginal short or condition will not occur as a short and image defect at a later time during the life of the display. Also, as part of the repair process, it may be necessary to grind away the seal area to remove any shorts and thus restore the image. In such cases, optionally, any depleted resizing seal 45 may be replenished, and, if so, the display may again be stress tested thereafter.

An example of using mechanical methods is to mechanically scratch or grind at the location on a cut edge where a short circuit is suspected to be until the symptoms of pixel failures in a test image go away. A short may sometimes be so weak that simply scratching the point of the short will eliminate it, and this would be indicated by the disappearance of the failed line of pixels 50 in the image.

However, the separation of the shorting electrodes is unknown and may be minimal. The short may reappear from minor contamination or mechanical provocation. Further, a near short is not typically attended to as its existence is not known. The mechanical method may be undiscerning and its use may inadvertently actually cause more near shorts. A near short is where the electrodes are very close to touching such that a future event during the life of the display may cause them to short and cause pixel failures. In such cases, it may be desirable to use mechanical methods in combination with one or more other methods.

An example of an electrical method is to apply an excess electrical voltage to the suspect electrodes 30. Typically, the shorts have a higher resistivity than the conductor lines 30. When a high d.c. or a.c. voltage of approximately ten times the nominal voltage is applied between two lines 30 and/or between a line 30 and the ground plane 35, as applicable, the shorts may open like a fuse in an electrical circuit. In an exemplary method, the voltage may be applied to the ground plane 35 as the display is displaying an image, e.g., by gradually increasing the voltage until the short fuses open. The shorting electrode would be significantly separated because of the magnitude of the electrical voltage and subsequent burning of the electrode.

An example of a chemical method is to apply an etching chemical along the cut edge 55 to remove the short circuit and/or other exposed circuit electrodes in the proximity of the cut edge 55. Since the conductive lines 30 are typically made of thin film metals, they may be etched back from the cut substrate edge 55 to the point where they are no longer in contact with each other, and this would be apparent by the disappearance of the line of failed pixels 50 in a test image. The etching may continue beyond the point of merely opening the short, for example, to increase the separation distance between the circuit electrodes in proximity of the cut edge 55, e.g., the offending electrodes. Optionally, the chemical etchant may react with the electrode and turn it into a dielectric. Thus, the electrodes may be separated and isolated more than may be accomplished by mechanical methods alone, since a mechanical method may only move the offending electrodes apart. The chemical etching may actually destroy the conductive properties of all the exposed electrodes, e.g., by altering their chemical formulation and/or electrical properties and/or turning them into dielectrics.

An example of a thermal method is to heat the local area of a short with a soldering iron or laser beam to thermally melt the electrodes within the sealant and/or glass until the short symptoms are removed. The melting of the electrodes may insure an area of destruction at the location of the short. This may also ensure a wider separation of the offending electrodes than simple mechanical scratching.

In accordance with an exemplary embodiment, a method is provided for resizing an electronic display that includes a front plate, a back plate, a perimeter seal spacing the front and back plates apart, and image-generating medium contained in an area between the front and back plates and within the borders of the perimeter seal. Generally, the method may include creating a scribe line along each of the front and back plates to identify a target portion and an excess portion of the display; breaking the display along the scribe lines to separate the target and excess portions of the display, thereby creating an exposed edge along the target portion communicating with the area between the plates of the target portion; pressing the plates of the target portion towards one another to space the plates apart by a predetermined cell gap; applying adhesive along the exposed edge.

Thereafter, any electrical shorts at the exposed edge of the target portion may be removed. For example, a mechanical force may be applied to a short circuit on the exposed edge in a manner sufficient to open the short circuit, an additional force may be applied to the opened short circuit, such as one or more of an electrical force, a chemical force, and a thermal force. Optionally, thereafter, a stress test may be performed, e.g., to test the opened short circuit. In addition, if desired, a protective material may be applied to an area adjacent the opened short circuit, e.g., additional adhesive and the like.

In accordance with another embodiment, a method is provided for repairing a short circuit in a resized flat panel display that includes obtaining a target portion of a resized flat panel display; identifying a short circuit in the target portion of the resized flat panel display, and a corresponding failed line of pixels on an image area of the target portion; and applying a mechanical force to the short circuit in a manner sufficient to open the short circuit, wherein the failed line of pixels disappears. An additional force may also be applied to the opened short circuit, such as an electrical force, a chemical force, and a thermal force, simultaneously with, subsequent to, or before, the mechanical force.

In accordance with still another embodiment, a method is provided for repairing a short circuit in a resized flat panel display that includes obtaining a target portion of a resized flat panel display; identifying a short circuit in the target portion of the resized flat panel display, and a corresponding failed line of pixels on an image area of the target portion; and simultaneously applying a mechanical force and a chemical force to the short circuit in a manner sufficient to open the short circuit, wherein the failed line of pixels disappears. Optionally, the opened short circuit may be stress tested, e.g., to verify that a failed line of pixels does not appear. In addition or alternatively, a protective material may be applied to an area adjacent the opened short circuit, e.g., after successfully completing the stress test.

In accordance with yet another embodiment, a method is provided for preventing a short circuit in a resized flat panel display that includes obtaining a target portion of a resized flat panel display; and applying a chemical etchant to a cut edge of the resized flat panel display, in a manner sufficient to increase the separation distance between circuit electrodes in proximity of the cut edge. In one embodiment, the cut edge of the resized flat panel display may be sealed with a resizing seal before the chemical etchant is applied. For example, the chemical etchant may be applied along the cut edge of the resized flat panel display in a manner sufficient to open an existing short circuit. Optionally, a mechanical force may be applied to the cut edge of the resized flat panel display substantially simultaneously with applying the chemical etchant.

In accordance with still another embodiment, a method is provided for ruggedizing a seal of a resized flat panel display that includes obtaining a target portion of a resized flat panel display having a resizing seal applied to a cut edge of the display; and scrubbing the resizing seal with a chemical-etchant-impregnated material in a manner sufficient to remove exposed electrodes from the resizing seal.

In accordance with yet another embodiment, a method is provided for ruggedizing a seal of a resized flat panel display that includes obtaining a target portion of a resized flat panel display having a resizing seal applied to a cut edge of the display; and rubbing the resizing seal with a chemical etchant sufficient to remove exposed electrodes.

In accordance with still another embodiment, a method is provided for resizing an electronic display, the display comprising a front plate, a back plate, a perimeter seal spacing the front and back plates apart, and image-generating medium contained in an area between the front and back plates and within the borders of the perimeter seal. Generally, the method includes cutting the display to separate a target portion from an excess portion, thereby creating an exposed edge along the target portion communicating with the area between the plates of the target portion; and applying adhesive along the exposed edge such that at least a portion of the adhesive extends in between the plates along the exposed edge. Thereafter, substantially all of the exterior adhesive may be removed along the exposed edge that extends from between the plates while the adhesive that extends in between the plates maintains a substantial seal along the exposed edge. In addition or alternatively, after applying the adhesive along the exposed edge, at least a portion of the plates of the target portion may be removed along the exposed edge while maintaining the substantial seal along the exposed edge.

Optionally, electrical shorts at the exposed edge of the target portion may be removed, e.g., after removing substantially all of the exterior adhesive and/or the portion of the plates along the exposed edge. Such shorts may be removed using various processes, for example, by applying a mechanical force to a short circuit on the exposed edge in a manner sufficient to open the short circuit; and applying an additional force to the opened short circuit, the additional force being selected from the group consisting of an electrical force, a chemical force, and a thermal force.

Other aspects and features of the need for and use of the present invention will become apparent from consideration of the following description taken in conjunction with the accompanying drawings.

BRIEF DESCRIPTION OF THE DRAWINGS

It will be appreciated that the exemplary embodiments shown in the drawings are not necessarily drawn to scale, with emphasis instead being placed on illustrating the various aspects and features of the illustrated embodiments.

DETAILED DESCRIPTION

Figure 1:
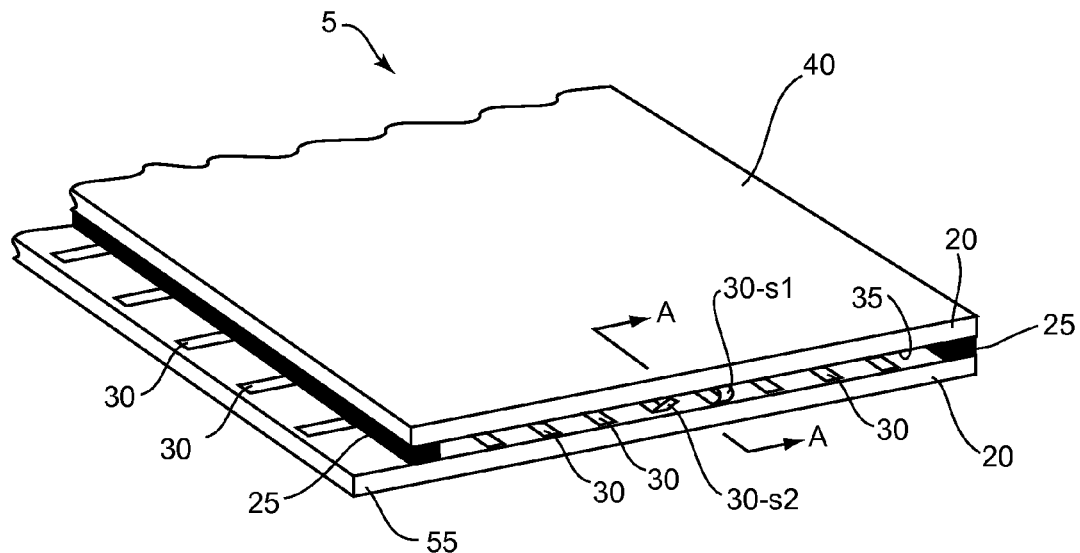
FIG. 1 is a perspective view of a cut edge 55 of the target portion 5 of an LCD being resized, before the cut edge 55 is resealed, showing two lines 30-s1, 30-s2 shorted to the ground plane 35. This is an example of the circuitry of the active matrix type of LCD. Other circuit elements that may contribute to the short circuit such as transistors, capacitors, and the like are not shown for simplicity.

The methods herein generally relate to resizing electronic displays, such as LCDs or other FPDs. Generally, such methods may involve cutting an electronic display along desired dimensions, resulting in a target display portion having an exposed edge and an excess display portion, and applying a seal along the exposed edge of the target display portion.

In an exemplary method, the display may be cut by one or more of the following steps: removing excess electronics from the display; cutting one or more circuit boards of the display; removing at least a portion of polarizers and/or other films, as necessary, from one or both plates of the display, e.g., along an intended cut line(s); cleaning along the intended cut line(s); and cutting or otherwise separating the display into a target portion and a waste or excess portion. An exemplary method for cutting the display may include scribing the plates along the desired line(s), e.g., with a glazer's wheel, saw, laser, and the like; and breaking the plates to separate the target portion from the excess portion, thereby creating an exposed edge along the target portion. Alternatively, the display may be cut using other methods, such as sawing partially or entirely through the plates, e.g., with a wafer saw, and the like, before or after removing polarizers and/or other films along the intended cut line(s).

To seal the exposed edge, the display may be stabilized, e.g., in a fixture to apply sufficient pressure to restore the original distance between the plates and/or prevent the plates from expanding. Liquid crystal (LC) may be removed from between the plates along the exposed edge, e.g., by wicking, draining, compressing the plates together to eject LC material, and the like, to create a region for sealant between the plates. Optionally, LC material may be injected between the plates, e.g., if excess material is ejected from between the plates. Adhesive or other sealant may be applied along the exposed edge, e.g., such that the sealant is allowed to flow, is forced, or otherwise penetrates between the plates along the exposed edge, e.g., without significantly changing the distance between the plates (called the "cell gap"). The sealant may be cured, e.g., using ultraviolet light, heat, and the like, thereby creating a barrier to prevent the image-generating medium from escaping out of the area between the plates. In addition or alternatively, one or more beads or other layers of adhesive or sealant may be applied externally along the cut edge, e.g., for environmental protection and/or edge light control. Additional information on methods for resizing electronic displays may be found in U.S. Pat. Nos. 7,535,547 and 7,780,492, incorporated by reference herein.

Optionally, after cutting and resealing the resized display, additional processes may be performed to reduce the "mullion," i.e., the inactive display area that extends between the active area of the resized display and the edges of the plates along the cut and resealed edge. Such reduction of the mullion, e.g., to not more than about 0.060 inch (1.5 mm), may facilitate tiling multiple displays together while minimizing the inactive space between the displays that may interfere with an overall image being presented on the tiled displays.

For example, if the cured sealant penetrates in between the plates sufficiently to provide a substantial seal, any external sealant may be removed, e.g., by mechanically grinding or scraping, chemically dissolving, and the like. In addition, if desired, the plates themselves may be ground or otherwise partially removed along the resealed edge to further the mullion created by the resized display, as long as the remaining sealant located between the plates provides a substantial seal to prevent leakage along the resealed edge.

The methods herein may facilitate repair and/or prevent electrical short circuits, which may occur during such resizing processes at one or more locations along the cut and/or resealed edge of the target portion 5 of the display.

Figure 1A:
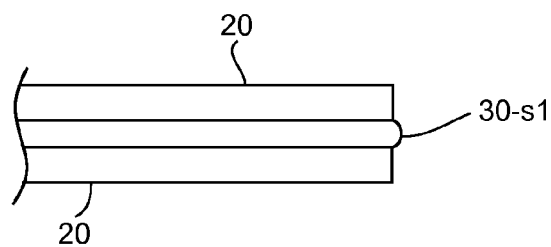
FIG. 1A is a cross-sectional detail of the target portion of FIG. 1, taken along line A-A.

Turning to FIG. 1, a perspective view is shown of a cut edge 55 of a target portion 5 of an LCD or other display being resized, which generally includes a pair of substrates or plates 20, an active image area 40, and an original seal 25 intact on the non-cut edges of the target portion 5. Thus, FIG. 1 represents the display after it has been cut as part of a resizing process, and before the cut edge 55 has been resealed. The edge of the cell is exhibited showing electrical conductor lines 30 and location of the ground plane 35. Two of the lines (30-s1 and 30-s2, as shown in FIG. 1A) are shown shorted to the ground plane 35. The display is not showing an image in FIG. 1. If it were, the shorts would cause a line in the image, e.g., a black, white, or colored line, due to the inability of the shorted line to control the corresponding pixels connected to it. In the embodiment shown in FIGS. 1 and 2, the original edge opposite the cut edge 55 (not shown for simplicity) includes external electronics to control the pixels and show an image on the active area of the display. The description of how the image is portrayed is not relevant to the methods herein and is well known to those skilled in the art.

In some cases, the cut edge 55 may be coincident with one of the conductor lines 30 on the lower edge extending along the cut edge 55, which would further complicate the nature of potential shorts along the cut edge 55. For example, in such situations, the shorts may potentially be so extensive that a narrow sliver of the substrate panel should be removed. This may occur when the cut edge 55 is on top of a conductor line 30 running parallel to the cut edge 55, e.g., between the lower and upper edges extending from the cut edge 55. In such situations, after the sliver is removed, the repair process may be repeated from the beginning Returning to FIG. 1, the shorted line 30-s2 is an example of a conductor line 30 that has separated from the substrate 20 of target portion 5 sufficiently to bridge the cell gap and make contact with the ground plane 35. Shorted line 30-s1 is an example of a conductor line 30 that has separated from the waste portion of the original display in sufficient length to fold back and bridge the cell gap to make contact with the ground plane 35. Shorted lines may occur in these manners, or in other manners. These shorted lines (30-s1 and 30-s2) are examples of the simplest form of short-circuits that may be repaired using the methods described herein.

Figure 2:
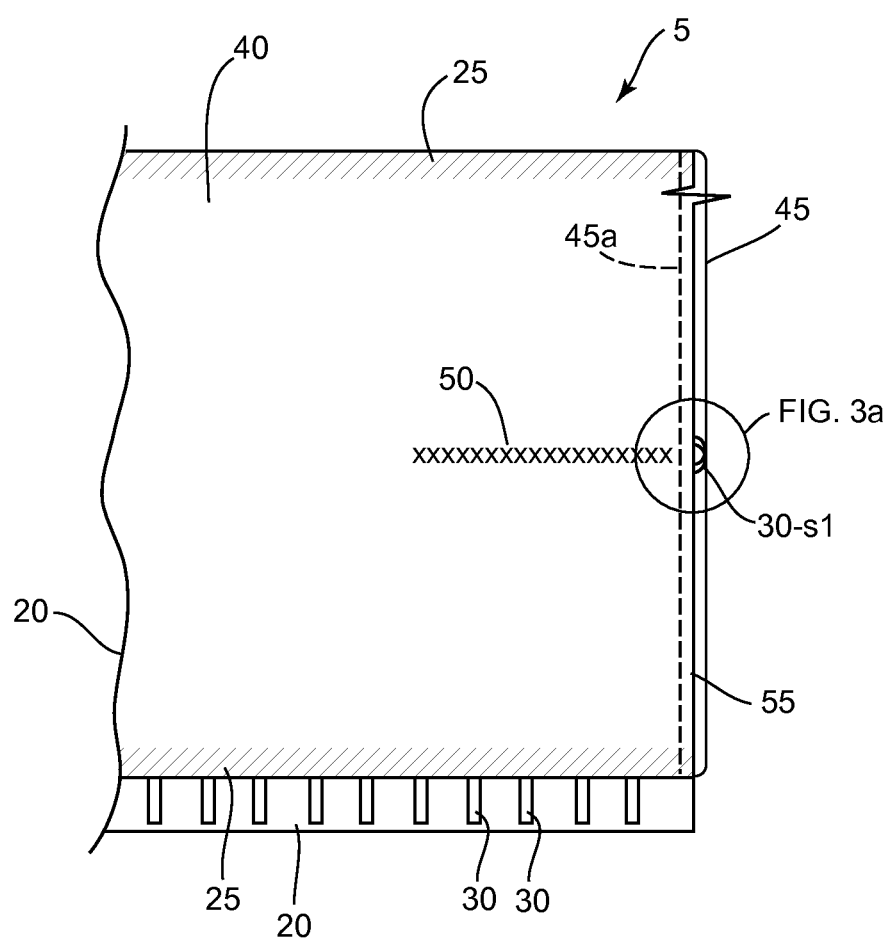
FIG. 2 is a plan view of the LCD in FIG. 1, after it has been resealed, showing a shorted conductor line 30-s1, and symbolically showing at 50 the symptoms of a line in the image of pixels failing to respond to the image signal associated with the shorted conductor line at the cut edge.

As part of the resizing process described elsewhere herein, the cut edge 55 is resealed. FIG. 2 is a plan view of the LCD in FIG. 1, after the LCD has been resealed along the cut edge 55 with resizing seal 45. The shorted conductor line 30-s1 is still undesirably present. Resizing seal 45 is shown penetrating in between the substrates 20 as indicated by dotted line 45a. Thus, the resizing seal 45 may include an internal portion 45a that extends between the substrates 20 and an external portion that is attached to the end surfaces of the substrates 20.

The symptoms of the failed pixels associated with the shorted conductor line 30-s1 are symbolically shown as x's 50. The x's 50 represent a line of pixels or a portion of a line of pixels missing in an image, e.g., a test image presented on the image area 40 of the target portion 5, emanating from the cut edge 55. The original perimeter seal 25 is shown along the non-cut edges for reference. In its simplest form, the image shown on the image area 40 in FIG. 2 may be a solid color with a line or partial line 50, e.g., a black, white, or color line depending on the default configuration of the display, not responding to the image commanded. The components for generating an image are not included in FIG. 2, but would require electrical connections to the electrical conductors 30 shown in the bottom of FIG. 2 and the left edge (not shown in FIG. 2). Methods for repairing these short circuits will now be described in more detail.

Figure 4:
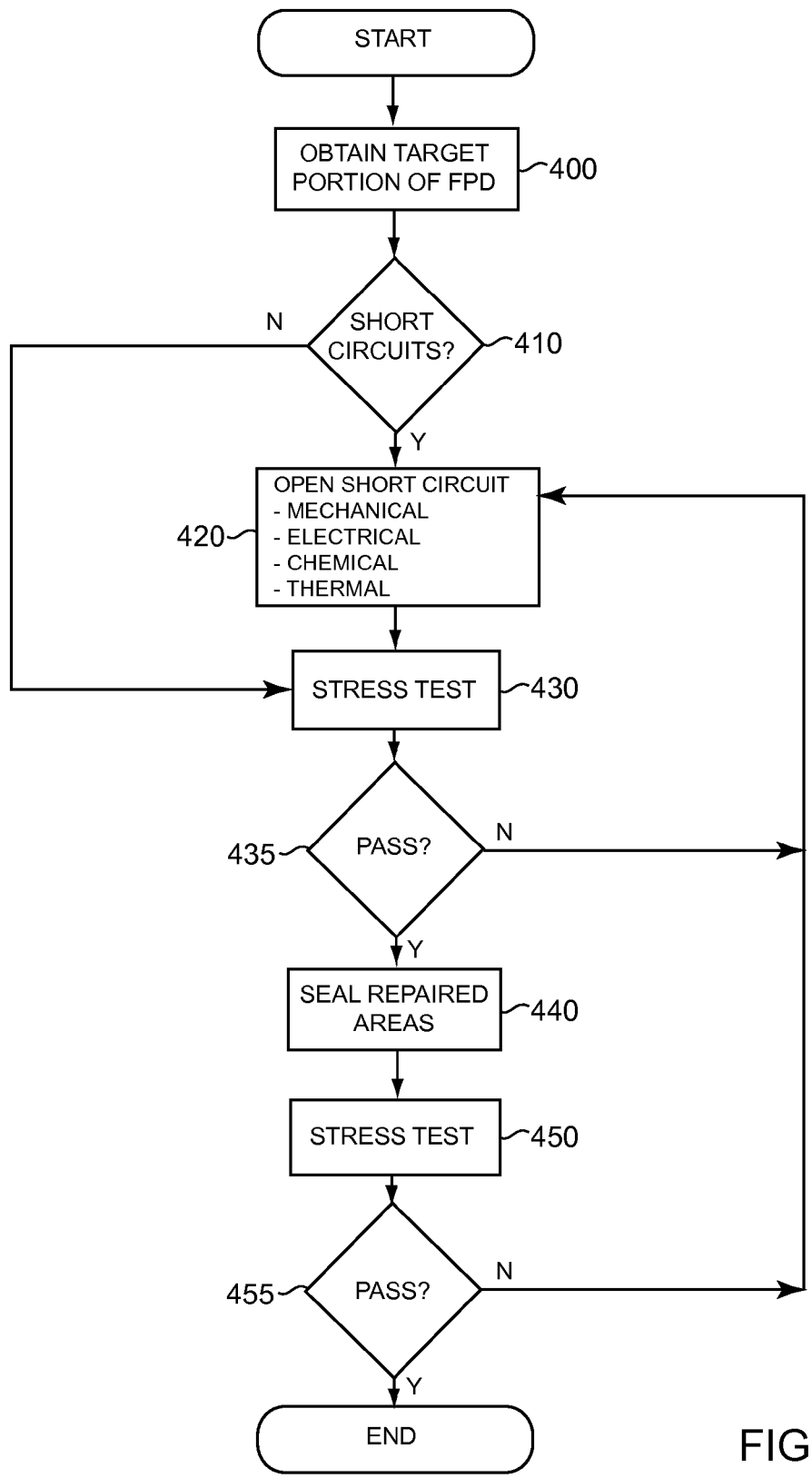
FIG. 4 is a flow diagram showing an exemplary method for repairing shorted lines in a target portion of a resized FPD.

Turning to FIG. 4, an exemplary method is shown for repairing shorted lines in a target portion 5 of a resized FPD. The method may be more easily performed while the FPD is displaying an image, so the effectiveness of the method may be seen at each step along the way. The method begins at step 400 by obtaining a target portion 5 of a resized FPD. This typically occurs as part of the overall resizing process, i.e., by separating a FPD into a target portion 5 and a waste or excess portion (not shown), as described elsewhere herein. However, the source of or process for obtaining the target portion 5 is not important to the repair method, such that this step may include simply being given the target portion 5 which may have been created by someone else doing a resizing operation. The target portion 5 of the FPD at this point typically would be operational.

Once the target portion 5 is obtained, short circuits are identified at step 410. Identification of a short circuit may be accomplished by electrically exciting the display to show an image on image area 40. Any shorts may result in one or more lines of nonresponsive pixels, seen symbolically as x's 50 in FIGS. 2 and 3A. The nonresponsive pixels will not actually appear as x's, but rather as pixel elements in the image display area 40 not responding correctly to the image commanded. The location of the short may be found by observing the intersections of the display image line of non-responding pixels 50 and the resized cut edge 55. A failed line of pixels 50 may fade in and out as the electrical current heats the point of contact and burns open the short. The length of the line of affected pixels 50 depends, in part, of the conductivity of the short.

If a short circuit has been identified at step 410, the method proceeds to step 420 at which the short is repaired. Here, the repair may be accomplished by applying: 1) a mechanical force to remove material to expose the short at a minimum or open the short; 2) a high voltage to the electrical conductive materials associated with the short to fuse open the short; 3) a chemical etchant (e.g., an acid or base) to etch away material constituting the short; 4) a thermal effect to burn open the short; 5) other methods to open the short such as re-cutting the panel to remove the portion of the panel with the short; or 6) any combination of the aforementioned, sequentially and/or substantially simultaneously. Each such repair may be performed in a manner sufficient to open the short circuit to cause the image to be complete and sufficiently to ensure that the short does not reoccur in any subsequent image.

If no short circuits are identified at step 410 (or after one or more have been identified, and then repaired at step 420), the method proceeds to step 430 at which optionally the display is stress tested for further reliability, and then, if applicable, to step 440 at which the exposed area (65) of the repaired short is resealed. Step 420 may also be performed to a cut edge 55 that has already been resealed with a resizing seal 45, e.g., to ruggedize the resizing seal 45, even if image defects are not exhibited initially. For example, the resizing seal 45 may be scrubbed with a chemical-etchant-impregnated material, such as a sanding block wetted with an acidic etchant, in a manner sufficient to remove exposed electrodes from the resizing seal, and to stress the resizing seal 45. The sanding block may then be used to sand the full length of the resealed edge of the resized display three or four times with moderate pressure. The moderate pressure is sufficient to remove a portion of the sealant with each stroke.

Also, the resizing seal 45 may be stress tested, and exposed electrodes removed, by simply rubbing the resizing seal 45 with a chemical etchant. Exposed electrodes should be removed because they may cause a short circuit at some later time in the FPD. This may be accomplished, e.g., using a cotton swab wet with the etchant agent. The seal line may be further stressed by rubbing it with a metal foil while displaying an image on the display, to see if the symptoms of a short occur. If there are exposed electrodes left on the resizing seal 45, the metal foil may short them during contact, and thus cause pixel failures. In that case, further etching may be accomplished to better ruggedize the seal, and, if necessary, the resizing seal 45 may be replenished at the affected area. The seal line may be further stressed while being cleaned, e.g., using a wet tissue with alcohol and water.

Stressing the display may be accomplished in many ways, including but not limited to rubbing the resized edge 55 with a wet and dry cotton swab or glass rod or wooden stick, rubbing the resized edge with metal conductive foil, flexing the target panels 20, and/or environmental cycling the LCD in a chamber in temperature and humidity over the required operating range and storage envelope. Step 440 may be applicable, for example, if the resizing seal 45 had already been applied to the cut edge 55 prior to arriving at step 420, and at step 420 the resizing seal 45 was disturbed. This situation is seen in FIG. 3B. Additional stress testing may occur at step 450, after the resealing step at 440. The seal may be stressed by flexing, for example, to cause near shorts to occur, thus exposing weak points that may be shorted during the normal handling, usage, and/or environmental variations to which the display may be exposed during its operational life.

FIG. 4 shows this process occurring once for all short circuits in parallel, but the process may be performed on a single short at a time. During stress testing at step 430, if the stress testing fails (i.e., one or more shorts are identified) as indicated by the "N" (no) path at decision 435, the process may return back to step 420 to repair the short(s) identified as part of the stress testing. During stress testing at step 450, if the stress testing fails as indicated by the "N" path at decision 455, the process may likewise return back to step 420 to repair the short(s) identified as part of the stress testing. Shorts typically do not recur if they pass a stress test. For further assurance that the short will not reappear and cause a pixel image failure symptom, or a new short will not appear and cause a pixel image failure, any resizing seal 45 removed may be replenished by applying a protective material 60 after removal of the short, as shown in FIG. 3C and at step 440 of FIG. 4.

As previously stated, any exposed area (65) of the resizing seal 45 exposed by the process may be covered to protect and prevent a recurrence of the short and insure the integrity of the seal 45 on the target portion 5. If the exposed area (65) is not covered, shorts may be induced by later disturbances such as physically rubbing the repaired area, or contamination with conductive materials. Further, the original display seal 25 itself may otherwise be compromised and need to be reconstituted. Also as previously stated, additional (or first-time) stress testing may occur after step 440. The stress test should include the entire cut edge even if no symptoms of shorts are exhibited at least once in the process.

Before or after the resizing seal 45 is replenished with protective material 60, it may be stress tested by rubbing the seal bead 45 with a wet cotton swab and/or a dry cotton swab (such as a Q-TIP® swab) three or more times and a metal foil three or more times. A suitable wetting agent is isopropyl alcohol. A suitable metal foil is aluminum foil. Any marginal situation will be flexed, shorted, or made conductive by the presence of an applicator's wetting agent and by rubbing motion pressure to apply the agent. The symptoms of intermittent shorts, if any, should then occur, thus allowing them to be identified. The intermittent shorts may then be eliminated by the methods described herein. This sequence may be repeated until the intermittent shorts do not recur. Marginal shorts may be readdressed by the same methods and retested and re-stressed until all symptoms of shorts are permanently removed. The stress test may also include environmental testing by, for example, cycling the panel thermally and/or with humidity. Such a stress test may be completed if the situation warranted a high degree of confidence that shorts would not reoccur. Further, the panel may be flexed along the cut edge 55 to induce slight motion in the internal aspects of the seal. If intermittent shorts should occur, then step 420 may be repeated to achieve further separation of the shorting elements. The repair process at step 420 will now be described in more detail.

At step 420, an example of mechanical force to open a short circuit is to mechanically remove material at the cut edge 55 in the vicinity of the short as exhibited by the failed line of pixels 50 in the image area 40 of the target portion 5, shown in FIG. 2. If the short is identified by stress testing after the resizing seal 45 is applied, then in most cases the failed line 50 may be fixed by simply scratching the surface of the resizing seal bead 45 with a sharp instrument. To remove more severe shorts, the resizing seal bead 45 may be scraped away and, in the most-severe cases, the substrate 20 may need to be removed to reach and open the short. When removing one short, another short may be precipitated as exhibited by the image. The mechanical action may be repeated until all of the failed lines of pixels are restored if possible.

A specific example of a mechanical method to open a short circuit in a target portion 5 of a resized LCD is by grinding down the resizing seal bead 45 with a high-speed grinder right at the point where the failed line of pixels 50 intercepts the cut edge 55 of the target portion 5. A DREMEL® tool with a cutting or grinding blade works well for this function. The blade may be held substantially perpendicular to the resizing seal bead 45 at the point to be repaired. While the DREMEL® tool is running at high speed, the surface of the bead 45 may be lightly contacted. Typically, the short may be removed in an instant with a small penetration into the bead 45. For more difficult shorts, as shown in FIG. 1 (represented by short 30-s2), the penetration into the bead 45 may be deeper based upon the effect seen in the displayed image. In difficult cases, the grinding action may penetrate into the glass substrate 20 before the short is extinguished and the repair may be completed. In more severe cases, the short may not be removed successfully using such mechanical methods. Further, while removing one short by such mechanical methods, another short may occur.

To reduce the risk of recurrence, electrical, chemical, thermal, and/or other methods may be used alone, or in combination with each other and/or mechanical methods, e.g., to achieve greater assurance that a short is removed and will not return.

An example of an electrical repair method is to apply an excess electrical voltage to the suspect electrodes 30. Since the shorts typically have a higher resistivity than the conductor lines, when a current limited high voltage (a.c. or d.c.),e.g., up to ten times the normal voltage, is applied between the suspect lines 30 and/or between the lines 30 and the ground plane 35, as applicable, the shorts may open like a fuse in an electrical circuit. The conductive metals may turn to oxides when fused open, e.g., to instantly become non-conductors. In some cases, the electrical fusing process may be used without any other adjunct action such as the mechanical or chemical methods described herein.

An example of a chemical repair method is to apply an etching chemical such as hydrochloric acid mixed approximately three to one with nitric acid. In some cases, even a small amount of citrus juice such as grapefruit juice may be sufficient. An exemplary method is to first open the sealant at the location of the short mechanically and then dab the acid along the cut edge 55 of the target portion 5 at the point of the short. The short may disappear with the mechanical action, but the acid etch may cause the shorting metals to be separated further. Since the conductive lines 30 are typically made of thin film metals such as aluminum, molybdenum, and the like, the conductor lines 30 may be etched back from the cut substrate edge 55 to the point where they are no longer in contact with each other or other conductors in the immediate area. This may be done before the target portion 5 is resealed at step 440, since, after resealing, the chemical would have to then penetrate the protective material 60 if applicable, and the resizing seal 45, unless the short extended beyond them. The chemical may be applied by dabbing with a glass rod wetted with the acid or a wooden stick wetted with the acid. The acid may be washed away after about a minute, e.g., with a water rinse, for example, by using a cotton swab followed with an isopropyl alcohol cleaning The short attended to by this series of operations may be completely resolved and this short is most likely ready to be repaired in step 440.

The most effective method using the chemical method is to apply it simultaneously while sanding the seal mechanically. As the mechanical action opens the short or potential short area, the chemical etches the electrodes further than may be achieved by simple mechanical methods. This dual action gives an increased margin of separation of the electrodes. Once the electrode is exposed by the mechanical action, it may be immediately etched away deep into the seal material that directly minimizes the degree of mechanical action needed. The combination of mechanical abrasion and chemical etching is more effective than either one alone or in sequence.

An example of a thermal repair method is to heat the local area of the short with a soldering iron or laser beam to thermally melt the electrodes within the sealant and/or glass until the short symptoms are removed. Apparatus and systems for opening electrical lines by a laser beam are well-known in the FPD industry. The thermal method may be particularly useful in situations where the short is located in between the substrates 20.

As previously mentioned, multiple forces may be applied substantially simultaneously at step 420, such as: mechanical and electrical; mechanical and chemical; mechanical and thermal; mechanical, electrical and chemical; mechanical, electrical and thermal; mechanical, chemical and thermal; and mechanical, electrical, chemical, and thermal. An example of using mechanical and chemical forces substantially simultaneously will now be described.

At step 420, an abrasive sanding block of approximately 220 grit may be wet with HCl and $HNO_4$ (aqua regia) diluted approximately 4:1 with water. Then, the surface of the resized seal bead may be scrubbed three or more times with the sanding block. Where a short or "line-out" 50 exists, the seal edge may be scrubbed with the sanding block using moderate hand pressure until the line is restored. A light touch with a DREMEL grinding tool or razor blade may be used if necessary to remove the short. The target portion 5 may be set aside for a few seconds to a minute to allow time for the acid to etch away exposed conductors. This sequence may be used when there is no initial short to insure that any undesirable electrodes are removed.

Then, for the first stress test at step 430, the seal may be rubbed with aluminum foil to stress the seal, e.g., rubbed at least three times using moderate finger pressure. The seal may be cleaned with a tissue wetted with about 91% isopropyl alcohol, e.g., until the seal is cleansed of any aluminum oxide and other byproducts from the acid treatment, which may be visually confirmed since the aluminum oxide stains the tissue black. It may take several rubbings using moderate finger pressure to remove the black aluminum oxide. When the tissue is finally clear of any discoloration after rubbing the seal, the seal may be cleaned again with a new clean tissue wetted with isopropyl alcohol using moderate finger pressure. If any shorts still appear or reappear, the process of repair (420) and stress test (430) may be repeated at the area of interest. If the seal is diminished from the application of this method, it may be replenished with protective material 60, if desired. The replenished area of the seal may require further stress testing and repair.

Alternatively, in a method that involves removing any external seal along the sealed edge and/or otherwise reducing the mullion, these processes may be repeated one or more times to repair any shorts and/or ensure that no shorts were created by the mullion reduction.

Figure 3A:
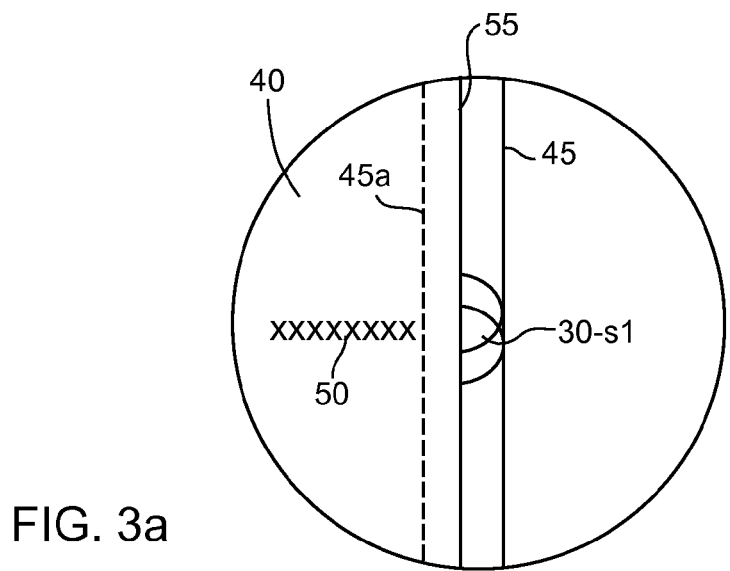
FIGS. 3A-3C are details showing: a) the conductor line 30-s1 shorted to the ground plane 35 as seen in FIG. 2; b) the shorted line after being opened; and c) the opened line after being resealed or covered with a dielectric 60. An example of the seal being penetrated and or substrate material being removed is not shown for simplicity.
Figure 3B:
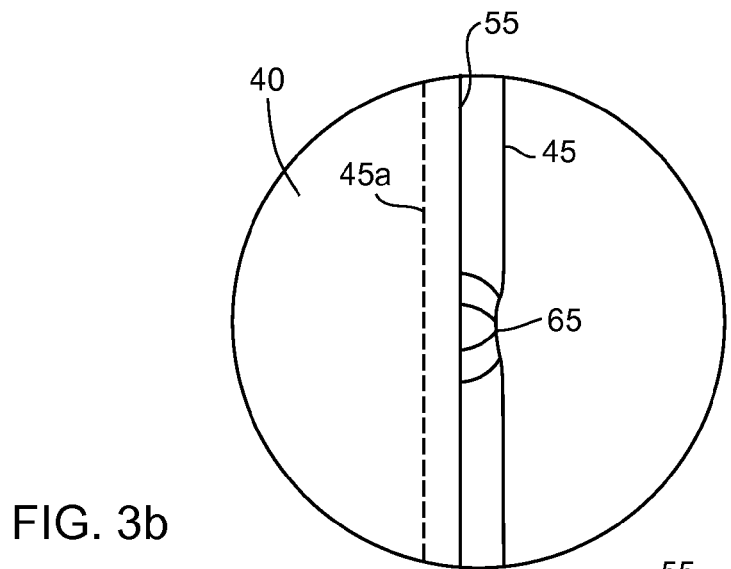
Figure 3C:
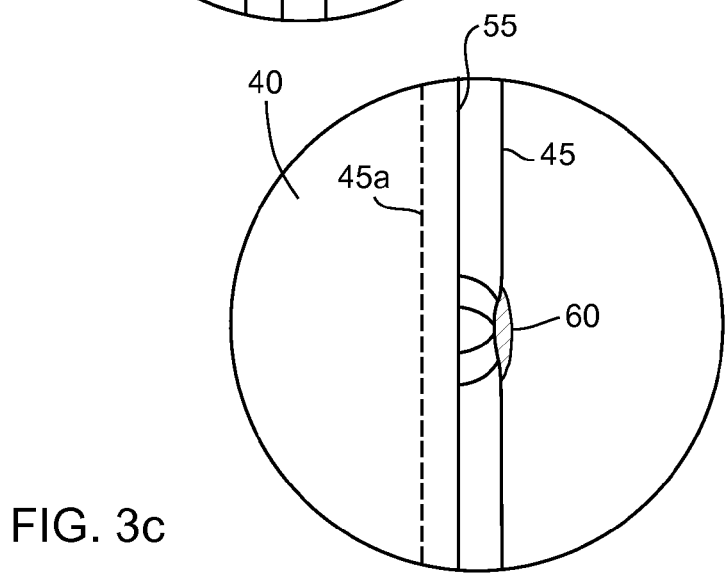

Turning now to FIG. 3, there is shown a series of details to help understand the methods described herein. FIG. 3A shows the conductor line 30-s1 shorted to the ground plane 35 as seen in FIG. 2, and within the resizing seal bead 45. FIG. 3B shows the shorted line 30-s1 of FIG. 3A after being opened using any of the methods described herein. For example, a mechanical force may have been applied to cut through the resizing seal bead 45 and the conductor 30-s1. Alternatively, the mechanical force may have been used to cut only partially through the resizing seal bead 45, or through the resizing seal bead 45 only, or through the resizing seal bead 45 and only partially through the conductor 30-s1. In these later cases, the short may be opened after the initial mechanical force, e.g., by using electrical, chemical, and/or thermal techniques, as described elsewhere herein. FIG. 3C shows the opened short line 30-s1 with the resizing seal bead 45 replenished using a protective material 60 to cover the area adjacent the repaired short circuit 30-s1. Protective material 60 may be the same as the sealant used to seal the cut edge 55 during the original resizing process, or it may be another dielectric.

The criteria for success in the process is that the symptoms of a failed line of pixels 50 in any image caused by a short at the cut edge 55 do not reappear permanently or intermittently (and that symptoms of no other failed line of pixels appear) during a stress test at the level that the display will see environmentally or mechanically during its operation.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the scope of the appended claims.

I claim:

1. A method for resizing an electronic display, the display comprising a front plate, a back plate, a perimeter seal spacing the front and back plates apart, and image-generating medium contained m an area between the front and back plates and within the borders of the perimeter seal, the method comprising:
    identifying a cut line along each of the front and back plates to identify a target portion and an excess portion of the display;
    causing the display to separate along the cut lines to separate the target and excess portions of the display, thereby creating an exposed edge along the target portion communicating with the area between the plates of the target portion;
    pressing the plates of the target portion towards one another to space the plates apart by a predetermined cell gap;
    applying adhesive along the exposed edge;
    and removing electrical shorts from electrodes at the exposed edge causing a partial image failure of the target portion, wherein removing electrical shorts comprises:
    applying a mechanical force to a short circuit on the exposed edge m a manner sufficient to open the short circuit; and
    applying an additional force to the opened short circuit, the additional force being selected from the group consisting of an electrical force, a chemical force, and a thermal force.

2. The method of claim 1, wherein the display comprises a liquid crystal display.

3. The method of claim 1, further comprising curing the adhesive applied along the exposed edge.

4. The method of claim 3, wherein the adhesive is cured using at least one of ultraviolet light and heat.

5. The method of claim 1, wherein the scribe line is created using one of a glass cutting scribe wheel, a wafer-type saw, and a fine-tooth saw.

6. The method of claim 1, wherein pressing the plates of the target portion towards one another comprises pressing the plates to force liquid crystal material from between the plates along the exposed edge, and wherein applying adhesive along the exposed edge comprises:
    applying a bead of adhesive along the exposed edge; and
    at least partially releasing the plates to draw the adhesive between the plates along the exposed edge.

7. The method of claim 1, wherein applying adhesive along the exposed edge comprises applying the adhesive along the exposed edge such that the adhesive flows at least partially between the plates.

8. The method of claim 1, further comprising stress testing the opened short circuit.

9. The method of claim 1, further comprising applying a protective material to an area adjacent the opened short circuit.

10. A method for preventing a short circuit in a resized flat panel display, comprising:
    obtaining a target portion of a resized flat panel display having a resizing seal applied to a cut edge of the display; and
    applying a chemical etchant to a cut edge of the resized flat panel display, in a manner sufficient to increase the separation distance between circuit electrodes in proximity of the cut edge.

11. The method of claim 10, wherein the cut edge of the resized flat panel display is sealed with a resizing seal before the chemical etchant is applied.

12. The method of claim 11, further comprising stress testing the resizing seal.

13. The method of claim 10, wherein the chemical etchant is applied along the cut edge of the resized flat panel display in a manner sufficient to open an existing short circuit.

14. The method of claim 10, further comprising applying a mechanical force to the cut edge of the resized flat panel display substantially simultaneously with applying the chemical etchant.

15. The method of claim 10, further comprising applying a protective material to a portion of the cut edge.

16. A method for ruggedizing a seal of a resized flat panel display, comprising:
    obtaining a target portion of a resized flat panel display having a resizing seal applied to a cut edge of the display; and
    rubbing the resizing seal with a chemical etchant sufficient to remove exposed electrodes.

17. The method of claim 16, wherein the chemical etchant is on a cotton swab while the rubbing occurs.

18. The method of claim 17, further comprising displaying an image on the target portion of the resized flat panel display while the rubbing occurs.

19. The method of claim 16, further comprising displaying an image on the target portion of the resized flat panel display while the rubbing occurs.

20. A method for resizing an electronic display, the display comprising a front plate, a back plate, a perimeter seal spacing the front and back plates apart, and image-generating medium contained in an area between the front and back plates and within the borders of the perimeter seal, the front and back plates being spaced apart by a predetermined cell gap, the method comprising:
    cutting the display to separate a target portion from an excess portion, thereby creating an exposed edge along the target portion communicating with the area between the plates of the target portion;
    applying adhesive along the exposed edge such that at least a portion of the adhesive extends between the plates along the exposed edge;
    removing substantially all of the exterior adhesive along the exposed edge that extends from between the plates while the adhesive that extends between the plates maintains a substantial seal along the exposed edge; and
    removing electrical shorts from electrodes at the exposed edge causing a partial image failure of the target portion after removing substantially all of the exterior adhesive.

21. The method of claim 20, further comprising, after applying the adhesive along the exposed edge, removing at least a portion of the plates of the target portion along the exposed edge while maintaining the substantial seal along the exposed edge.

22. The method of claim 20, wherein removing electrical shorts comprises:
    applying a mechanical force to a short circuit on the exposed edge in a manner sufficient to open the short circuit; and
    applying an additional force to the opened short circuit, the additional force being selected from the group consisting of an electrical force, a chemical force, and a thermal force.

* * * * *